United States Patent [19]

Nagai et al.

[11] Patent Number: 5,781,577
[45] Date of Patent: Jul. 14, 1998

[54] SEMICONDUCTOR LASER

[75] Inventors: Yutaka Nagai; Akihiro Shima, both of Tokyo, Japan

[73] Assignee: Mitsubishi Denki Kabushiki Kaisha, Tokyo, Japan

[21] Appl. No.: 586,155

[22] Filed: Jan. 17, 1996

[30] Foreign Application Priority Data

Mar. 2, 1995 [JP] Japan ................... 7-042775

[51] Int. Cl.$^6$ ........................................ H01S 3/18
[52] U.S. Cl. ........................................ 372/46; 372/45
[58] Field of Search ........................... 372/46, 45

[56] References Cited

U.S. PATENT DOCUMENTS

| | | | |
|---|---|---|---|
| 4,875,216 | 10/1989 | Thornton et al. | 372/45 |
| 5,020,067 | 5/1991 | Okada | 372/46 |
| 5,065,403 | 11/1991 | Komazaki | 372/46 |
| 5,089,437 | 2/1992 | Shima et al. | 437/129 |
| 5,153,890 | 10/1992 | Bona et al. | 372/46 |
| 5,161,166 | 11/1992 | Shima et al. | 372/46 |
| 5,181,218 | 1/1993 | Ishikawa et al. | 372/45 |
| 5,280,535 | 1/1994 | Gfeller et al. | 372/45 |
| 5,469,457 | 11/1995 | Nagai et al. | 372/45 |
| 5,608,752 | 3/1997 | Goto et al. | 372/46 |

FOREIGN PATENT DOCUMENTS

| | | | |
|---|---|---|---|
| 0437243 | 7/1991 | European Pat. Off. | |
| 62-79686 | 4/1987 | Japan | |
| 1175790 | 7/1989 | Japan | |
| 266984 | 3/1990 | Japan | |
| 461391 | 2/1992 | Japan | |
| 6-302906 | 10/1994 | Japan | 372/46 |

OTHER PUBLICATIONS

Arimoto et al, "150 mW Fundamental–Transverse–Mode Opertion Of 670 nm Window Laser Diode", IEEE Journal of Quantum Electronics, vol. 29, No. 6, 1993, pp. 1874–1878 Jun.

Primary Examiner—Rodney B. Bovernick
Assistant Examiner—Yisun Song
Attorney, Agent, or Firm—Leydig, Voit & Mayer, Ltd.

[57] ABSTRACT

A semiconductor laser includes a first conductivity type semiconductor substrate, a first conductivity type lower cladding layer, a quantum well structure active layer including alternately laminated barrier and well layers, a disordered region extending to laser resonator facets, a second conductivity type first upper cladding layer disposed on the quantum well structure active layer, a ridge structure disposed on the first cladding layer, and having a first region not proximate the laser resonator facets including a second conductivity type second upper cladding layer and a second conductivity type first contact layer and a second region, proximate a laser resonator facet having a first conductivity type first semiconductor layer of the same material and thickness as the second upper cladding layer and a first conductivity type second semiconductor layer of same material as the first contact layer, a first conductivity type current blocking layer having a band gap energy larger than that of the second upper cladding burying the ridge structure, and a second conductivity type second contact layer disposed on the current blocking layer and the ridge structure. The band gap energy at the laser resonator facets is larger than in other regions and serves as a window structure. A refractive index distribution in the transverse direction confines laser light in the transverse direction below the ridge structure and there is no astigmatism.

2 Claims, 5 Drawing Sheets

Prior Art

Prior Art

SEMICONDUCTOR LASER

FIELD OF THE INVENTION

The present invention relates to semiconductor lasers and, more particularly, to a semiconductor laser having a window structure at facets and producing high-power light output. The invention also relates to a method for fabricating such a semiconductor laser.

BACKGROUND OF THE INVENTION

Figure 4:
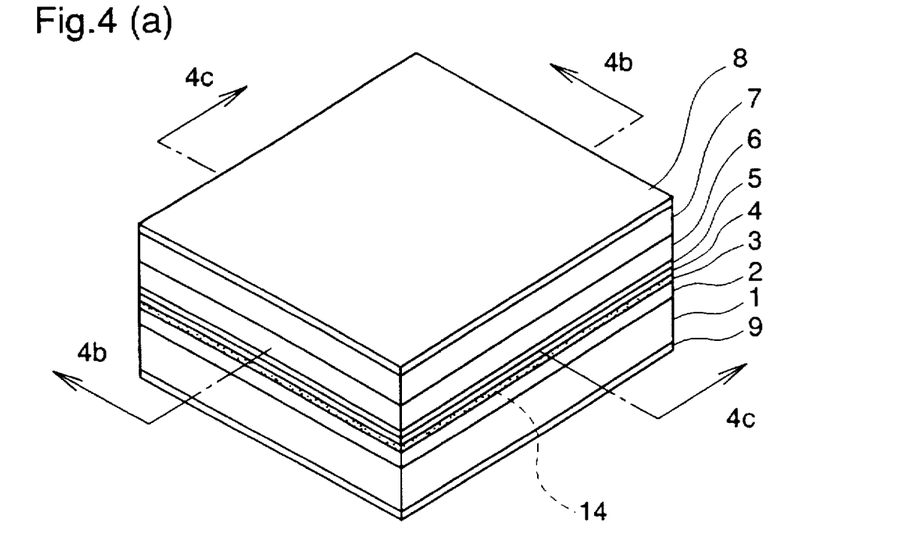
FIGS. 4(a)–4(c) are diagrams illustrating a structure of a semiconductor laser according to the prior art.

FIGS. 4(a)–4(c) are diagrams illustrating a structure of a prior art semiconductor laser proposed by the inventor of the present invention. FIG. 4(a) is a perspective view showing the entirety of the semiconductor device, FIG. 4(b) is a cross-sectional view taken along a line 4b—4b in FIG. 4(a), i.e., a cross-sectional view in the resonator length direction of the semiconductor laser, and FIG. 4(c) is a cross-sectional view taken along a line 4c—4c in FIG. 4(a), i.e., a cross-sectional view in the direction perpendicular to the resonator length direction (hereinafter, referred to as the resonator width direction) including a ridge structure region. In the figures, numeral 1 designates an n type GaAs semiconductor substrate, numeral 2 designates an n type $Al_{0.5}Ga_{0.5}As$ lower cladding layer 1.5–2 μm thick, numeral 3 designates a quantum well structure functioning as an active layer and comprising $Al_{0.05}Ga_{0.95}As$ well layers (not shown) and $Al_zGa_{1-z}As$ barrier layers (not shown) having an Al composition z of 0.3–0.35. This quantum well structure includes light guide layers which have the same composition as that of the barrier layers and which are respectively 0.2–0.3 μm thick at both sides of the quantum well structure, and two well layers about 80 Å thick and a barrier layer 50–80 Å thick, alternately laminated, between the optical guide layers. Numeral 4 designates a p type $Al_{0.5}Ga_{0.5}As$ first upper cladding layer 0.2–0.3 μm thick, numeral 5 designates a p type $Al_{0.7}Ga_{0.3}As$ etch stopping layer about 200 Å thick, numeral 6 designates an n type $Al_{0.7}Ga_{0.3}As$ current blocking layer 1.5–2 μm thick, numeral 7 designates a p type GaAs second contact layer 2–3 μm thick. Numeral 8 designates a p side electrode, numeral 9 designates an n side electrode, numeral 10 designates a p type $Al_{0.5}Ga_{0.5}As$ second upper cladding layer 0.8–1.3 μm thick, and numeral 11 designates a p type GaAs first contact layer about 0.7 μm thick. Numeral 12 designates a ridge structure. This ridge structure 12 has a reverse-trapezoidal configuration such that the width in the resonator width direction on the side of the n side electrode 9 of about 4 μm and a width in the resonator width direction on the side of the p side electrode 8 of about 5–6 μm. Further, it has a length in the resonator length direction such that the end of the ridge structure 12 does not reach the laser resonator facet. Numeral 14 designates a quantum well structure layer which is disordered by ion implantation of Si, numeral 30 designates a light emission region of the semiconductor laser, and numeral 31 designates a window structure region of the semiconductor laser. Reference character d represents the distance between the laser resonator facet and the ridge structure 12 in the laser resonator length direction, i.e., the astigmatism. In addition, the length of the laser element in the resonator length direction is 300–600 μm , and the width is about 300 μm.

FIGS. 5(a)–5(d) are perspective views illustrating process steps in a method of fabricating a prior art semiconductor laser for one laser chip. In these figures, the same reference numerals designate the same elements as those in FIG. 4. Numeral 20a designates an insulating film. Numeral 25 designates ion implantation of Si.

2

Figure 5:
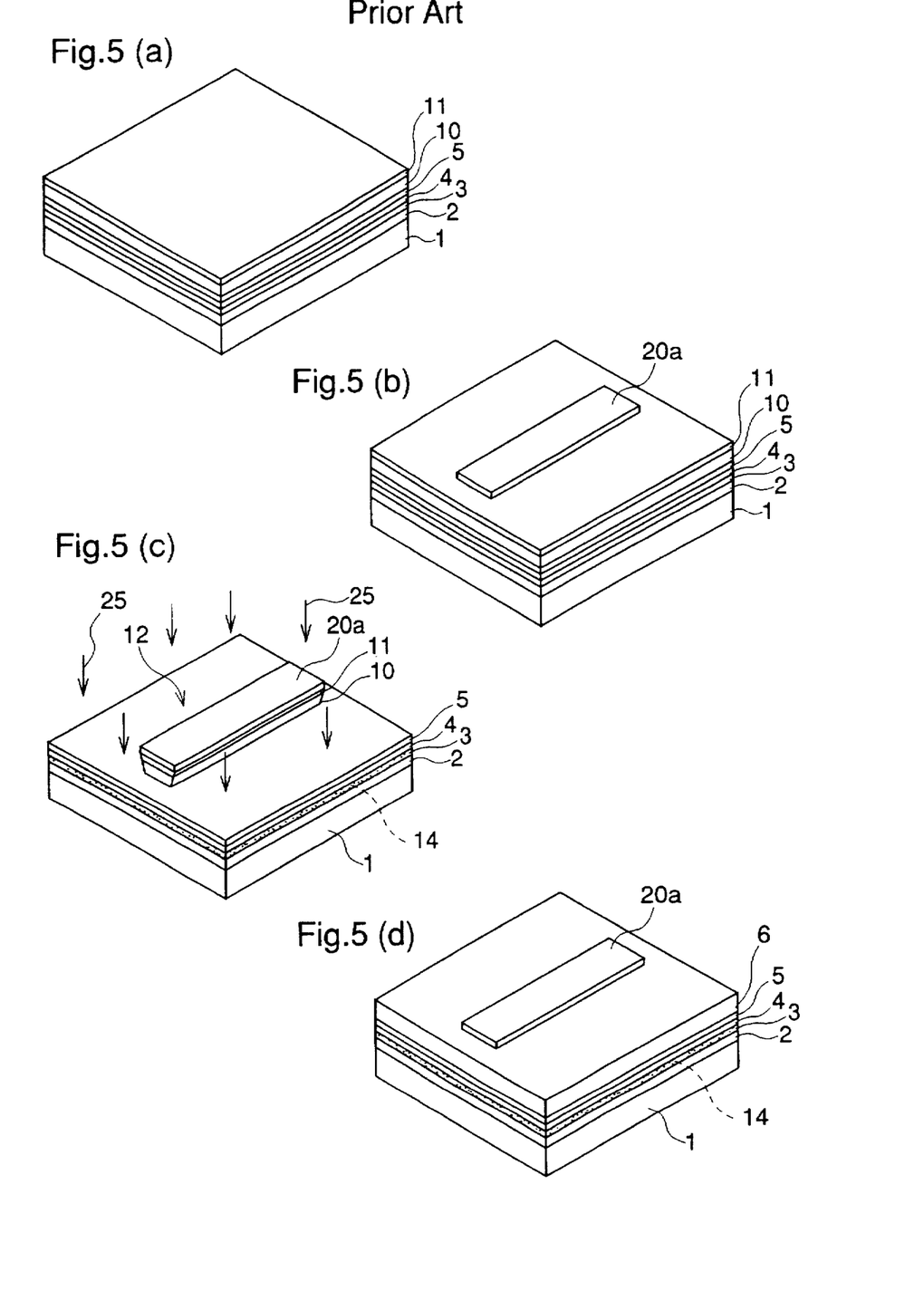
FIGS. 5(a)–5(d) are process diagrams illustrating a method for fabricating the semiconductor laser according to the prior art.

A fabricating method will be described with reference to FIGS. 5(a)–5(d). On the n type GaAs semiconductor substrate 1, the lower cladding layer 2, the quantum well structure layer 3, the first upper cladding layer 4, the etch stopping layer 5, the second upper cladding layer 10, and the first contact layer 11 are successively epitaxially grown, thereby producing a semiconductor laminated layer structure. A perspective view of the semiconductor laminated layer structure after the growth is shown in FIG. 5(a). Next, an insulating film 20a is formed on the entire surface of the semiconductor laminated layer structure. As a material of the insulating film, $Si_3N_4$ or $SiO_2$ is used. This insulating film is patterned in a stripe shape such the resonator width becomes about 5–6 μm , with intervals of about 20 μm from the resonator facets of the semiconductor laser as shown in FIG. 5(b).

This insulating film 20a functions as a mask for ridge etching and, as shown in FIG. 5(c), the etching is performed to form a ridge structure 12 using the insulating film 20a as a mask. This etching is performed using a selective etchant which etches the p type GaAs first contact layer 11 and the p type $Al_{0.5}Ga_{0.5}As$ second upper cladding layer 10 but does not etch the p type $Al_{0.7}Ga_{0.3}As$ etch stopping layer 5; whereby the ridge structure 12 can be produced with high reproducibility. As an example of the etchant, a mixture of tartaric acid and hydrogen peroxide is given. After forming the ridge structure 12, Si 25 is ion implanted into the quantum well structure layer 3 from the surface exposed by the etching. Though this ion implantation is simultaneously performed to the upper surface of the semiconductor laminated layer structure, since the insulating film 20a is formed at the upper portion of the ridge structure 12, and the upper surface of the first contact layer 11 of the ridge structure 12 and the upper surface of the insulating film 20a are spaced apart from each other by the height of the insulating film 20a, the ions do not reach the ridge structure 12 and no ions are implanted in the ridge structure 12. However, a region where Si ions are inplanted is formed in the quantum well structure layer 3 in a region other than the lower region of the ridge structure 12. Disordering is not produced solely by ion implantation and it occurs for the first time when the Si atoms are diffused in the crystal by some annealing process. So, the semiconductor laminated layer structure is annealed after the ion implantation or the semiconductor laminated layer structure is heated by the heat generated during the crystal growth after that process, whereby Si atoms are diffused, resulting in the disordered quantum well structure layer 14. Portions of the disordered quantum well structure layer 14 in the proximity of the laser resonator facets become the window structure region 31 which functions as a window structure. Here, first of all, the disordered quantum well structure layer 14 is formed by annealing. Next, the n type $Al_{0.7}Ga_{0.3}As$ current blocking layer 6 is selectively grown to bury the ridge structure 12 as shown in FIG. 5(d). Besides, crystal growth does not occur on the ridge portion 12 because the insulating film 20 also serves as a mask during the crystal growth. After the insulating film 20 is removed by wet etching or dry etching, the p type GaAs second contact layer 7 is grown. Thereafter, the n side electrode 9 is formed on the n type GaAs semiconductor substrate 1 and the p side electrode 8 is formed on the p type GaAs second contact layer 7, resulting in a semiconductor laser having a window structure as shown in FIG. 4(a).

A description is given of the operation. In the semiconductor laser having a ridge structure shown in FIG. 4(a), in the region buried with the n type $Al_{0.7}Ga_{0.3}As$ current blocking layer 6, pn junctions are formed between the p type AlGaAs first upper cladding layer 4 and the n type current blocking layer 6 and between the n type current blocking layer 6 and the p type GaAs second contact layer 7, respectively, and even when a voltage is applied so that the p side electrode 8 becomes plus, one of the pn, junctions is reverse biased, so that no current flows in the region including the blocking layer 6. In other words, the n type current blocking layer 6 blocks current. Accordingly, when a voltage is applied so that the p side electrode 8 is plus and the n side electrode 9 is minus, holes are injected into the quantum well structure layer 3 below the ridge structure 12 through the p type first contact layer 11, the p type second upper cladding layer 10, and the p type AlGaAs first upper cladding layer 6, and electrons are injected into the quantum well structure layer 3 through the n type GaAs semiconductor substrate 1 and the n type AlGaAs cladding layer 2, whereby recombination of electrons and holes occurs in the quantum well structure layer 3, generating induced radiation of light. When the quantity of carriers injected is sufficiently increased so that light exceeding the loss of waveguide is generated, laser oscillation occurs.

A description is given of light guided to the region where the ridge structure 12 is formed, that is, the light generation region 30 where the laser light is generated. In the vertical direction of a semiconductor laser, i.e., in the direction perpendicular to the growth surface of the substrate 1, the quantum well structure layer 3 serving as an active layer is sandwiched the second upper cladding layer 10 and the lower cladding layer 2 which have a larger energy band gap than the quantum well structure layer 3, so that a refractive index distribution is produced in the vertical direction of the semiconductor laser and the light is confined in the proximity of the quantum well structure layer 3 and guided along the quantum well structure layer 3. In addition, since in the transverse direction of a semiconductor laser, i.e., in the resonator width direction, the n type $Al_{0.7}Ga_{0.3}As$ current blocking layer 6 having a larger energy band gap than the p type $Al_{0.5}Ga_{0.5}As$ second upper cladding layer 10 constituting the ridge structure 12 is formed at the both sides of the ridge structure 12 sandwiching the ridge structure 12. A refractive index distribution is produced in the transverse direction of the semiconductor laser and the laser light is confined in the transverse direction by the refractive index difference between the second upper cladding layer 10 and the current blocking layer 6, and it is guided along the ridge structure 12.

A description is given of the window structure. Generally, in an AlGaAs series semiconductor laser which emits laser light having a wavelength of 0.8 μm and is used as a light source for optical disc devices, such as compact discs (CD), the maximum output determined by a optical output at which laser resonator facet destruction occurs. The facet destruction occurs because the crystal itself constituting the quantum well structure layer of the semiconductor laser is melted by the heat generated due to absorption of laser light which is produced when the energy band gap in the proximity of the facet is effectively increased by the influence of the energy levels in the facet region. When this facet destruction occurs, the function of the resonator is not effected. Accordingly, in order to realize a high-power output operation, it is required to generate no facet destruction even at a high power output. For this purpose, it is quite effective to provide a structure that makes it difficult for the laser light to be absorbed in the facet region, i.e., a window structure which becomes "transparent" to the laser light. This window structure is formed so that the energy band gap of the region in the proximity of the facet is larger than that of the quantum well structure which emits the laser light. In the prior art semiconductor laser shown in FIG. 15(a), the active layer is formed by a quantum well structure layer 3, and this quantum well structure layer 3 in the vicinity of the laser resonator facet is disordered by the ion implantation of Si. This disordering makes the constituent elements of the respective thin layers included in the quantum well structure layer mix with each other to form a uniform composition layer. The quantum well structure layer 14 in the disordered region has an effective energy band gap larger than those in other regions of the quantum well structure layer 3. Therefore, in the prior art semiconductor laser, the energy band gap is larger in the quantum well structure layer 14 in the proximity of the laser resonator facet than in the quantum well structure layer 3 below the ridge structure 12 serving as a waveguide of the laser light, whereby the resonator facet proximity region functions as a window structure.

The prior art semiconductor laser including the ridge structure with the window structure is constructed as described above, and it is very useful for preventing destruction of the laser resonator facet. However, it has the following problems. That is, since the quantum well structure 3 which serves as an active layer is sandwiched by the n type $Al_{0.5}Ga_{0.5}As$ lower cladding layer 2 and the p type $Al_{0.5}Ga_{0.5}As$ second upper cladding layer 10, which layers have larger band gap energies than that of the quantum well structure 3, or by the lower cladding layer 2 and the n type $Al_{0.7}Ga_{0.3}As$ current blocking layer 6 in both the light emission region 30 and the window structure region 31 in the resonator length direction, a refractive index distribution in the vertical direction of the semiconductor laser exists, whereby laser light travels along the quantum well structure 3 without widening until it reaches the semiconductor laser facet, and it is emitted, with widening, from the laser facet.

In the light emission region 30, the n type $Al_{0.7}Ga_{0.3}As$ current blocking layer 6 having a larger band gap energy than the second upper cladding layer 10 is provided at both sides of the p type $Al_{0.5}Ga_{0.5}As$ second upper cladding layer 10 constituting the ridge structure 12, so that a refractive index distribution exists in the transverse direction of the semiconductor laser, whereby the light is confined in the region below the second upper cladding layer 10, and the light generated in the quantum well structure 3 below the ridge structure 12 is guided along the ridge structure 12.

However, the same current blocking layer 6 as in the region other than the waveguide region is formed in the extended region of the ridge structure 12 in which the light is guided, and the laser light which is guided without widening due to being confined in the transverse direction in the laser emission region 30 where the refractive index distribution in the transverse direction exists, is guided, while widening in the transverse direction, in the window structure region 31 because the refractive index distribution does not exist in the transverse direction in the window structure region 31. Therefore, the points at which the laser light begins widening are different between the vertical direction and the transverse direction, so that an astigmatism d in the distance between the ridge edge and the laser facet is generated. In a conventional apparatus using a semiconductor laser, the light emitted from the semiconductor laser is concentrated using a lens to produce a light having a small spot size for use and, in this case, a minute spot size desired. However, when the astigmatism d is generated, the focus of the lens for concentrating the emitted laser light shifts because of the astigmatism between the vertical direction and the transverse direction, so that it is impossible to simultaneously adjust the focus in the vertical direction and the transverse direction. As a result, only laser light with a large spot size is obtained.

SUMMARY OF THE INVENTION

It is an object of the present invention to provide a semiconductor laser including a window structure and producing laser light with a small spot size, and a fabricating method thereof.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor laser comprises a first conductivity type semiconductor substrate, a first conductivity type lower cladding layer disposed on the first conductivity type semiconductor substrate, a quantum well structure active layer comprising alternately laminated barrier layers and well layers, disposed on the lower cladding layer, a disordered region formed in the quantum well structure active layer in the proximity of a laser resonator facets by introduction of impurities, a second conductivity type first upper cladding layer disposed on the quantum well structure active layer, a ridge structure disposed on the first cladding layer and extended in the resonator length direction with a length reaching the resonator facets, said ridge structure having a first region, other than the proximity of the laser resonator facets, comprising a second conductivity type second upper cladding layer and a second conductivity type first contact layer which are disposed on the second upper cladding layer, and a second region, in the proximity of the laser resonator facets, comprising the first conductivity type first semiconductor layer having the same material and height as the second upper cladding layer and the first conductivity type second semiconductor layer having the same material as the first contact layer which are disposed on the first semiconductor layer, a first conductivity type current blocking layer having an energy band gap larger than that of the second upper cladding layer disposed on the first upper cladding layer to bury the ridge structure and a second conductivity type second contact layer disposed on the current blocking layer and the ridge structure. Therefore, the band gap energy in the vicinity of the laser resonator facet of the quantum well structure active layer is larger than those in other regions, which serves as a window structure, and in the region where the window structure is formed, refractive index distribution in the transverse direction is also obtained, and laser light is confined in the transverse direction below the entire ridge structure between the laser resonator facets, and there is no astigmatism due to presence and absence of the refractive index distribution in the vertical and the transverse directions of the laser.

According to a second aspect of the present invention, in the above-described semiconductor laser the semiconductor substrate comprises n type GaAs, the lower cladding layer comprises n type $Al_xGa_{1-x}As$ (0<x), the quantum well structure active layer comprises $Al_yGa_{1-y}As$ (0<y) barrier layers and $Al_zGa_{1-z}As$ (0≦z<y) well layers, and has an effective energy band gap smaller than that of the lower cladding layer, the first and the second upper cladding layers comprises p type $Al_wGa_{1-w}As$ having a larger effective energy band gap than that of the quantum well structure active layer, the first and second contact layers comprise p type GaAs, the first semiconductor layer comprises n type $Al_wGa_{1-w}As$, the second semiconductor layer comprises n type GaAs, and the current blocking layer comprises n type $As_vGa_{1-v}As$ (v>w). Therefore, a window structure is formed in the vicinity of the laser resonator facet, and refractive index distribution in the transverse direction is formed in the region where the window structure is formed, and laser light is confined in the transverse direction below the entire ridge structure between the resonator facets, and there is no astigmatism due to presence and absence of the refractive index distribution in the vertical and the transverse directions.

According to a third aspect of the present invention, a method for fabricating a semiconductor laser comprises successively epitaxially growing on a first conductivity type substrate a first conductivity type lower cladding layer, a quantum well structure active layer comprising alternately laminated barrier layers and well layers, a second conductivity type first upper cladding layer, a second conductivity type second upper cladding layer, and a second conductivity type first contact layer, forming a first insulating film on a region including a region to be a laser light emitting region other than a region in the proximity of the resonator facets on the first contact layer, performing a first removing process for removing portions of the first contact layer and the second upper cladding layer on the region in the proximity of the laser resonator facets using the first insulating film as a mask, performing ion implantation of impurity dopant to a concentration which does not invert the conductivity type of the second upper cladding layer, from the surface of the second upper cladding layer to the quantum well structure active layer below the region exposed by the first removal process, disordering, by annealing, the quantum well structure active layer in the region where the ion implantation is performed, regrowing a first conductivity type first semiconductor layer comprising the same material as the second upper cladding layer to the same height as the second upper cladding layer using the first insulating film as a mask so that the region exposed by the first removal process is buried, regrowing a first conductivity type second semiconductor layer comprising the same material as the first contact layer to the same height as the first contact layer using the first insulating film as a mask, after removing the first insulating film, forming a stripe shaped second insulating film having a length reaching the laser resonator facets on the first contact layer and on the second semiconductor layer, including a region on the region of the first contact layer to be a laser emitting region, performing a second removing process for removing the first contact layer, the second semiconductor layer, the second upper cladding layer, and the first semiconductor layer, thereby forming a ridge structure, forming a first conductivity type current blocking layer having a larger energy band gap than that of the second upper cladding layer on the first upper cladding layer exposed by the second removal process so that the ridge structure is buried, and after removing the second insulating film, forming a second conductivity type second contact layer on the ridge structure and on the current blocking layer. Therefore, the band gap energy in the vicinity of the laser resonator facet of the quantum well structure active layer is larger than those in other regions, which serves as a window structure, and in the region where the window structure is formed, refractive index distribution in the transverse direction is also obtained, laser light is confined in the transverse direction below the entire ridge structure between the laser resonator facets, and there is no astigmatism due to the presence and absence of the refractive index distribution in the vertical and the transverse directions.

According to a fourth aspect of the present invention, in the above-described semiconductor laser, the semiconductor substrate comprises n type GaAs, the lower cladding layer comprises n type $Al_xGa_{1-x}As$ (0<x), the quantum well structure active layer comprises $Al_yGa_{1-y}As$ (0<y) barrier layers and $Al_zGa_{1-z}As$ (0≦z<y) well layers, and had an effective band gap energy smaller than that of the lower cladding layer, the first and the second cladding layers comprise p type $Al_wGa_{1-w}As$ having a larger effective band gap energy than that of the quantum well structure active layer, the first and second contact layers comprise p type GaAs, the first semiconductor layer comprises n type $Al_wGa_{1-w}As$, the second semiconductor layer comprises n type GaAs and the current blocking layer comprises n type $Al_vGa_{1-v}As$ (v>w). Therefore, a window structure is formed in the vicinity of the laser resonator facet, and in the region where the window structure is formed, refractive index distribution in the transverse direction is also obtained, and laser light is confined in the transverse direction below the entire ridge structure between the laser resonator facets, and there is no astigmatism due to the presence and absence of the refractive index distribution in the vertical and the transverse directions.

According to a fifth aspect of the present invention, the above-described fabricating method of a semiconductor laser comprises, epitaxially growing a second conductivity type etch stopping layer between the second conductivity type first upper cladding layer and the second conductivity type second upper cladding layer, performing the first removal process by selectively etching the first contact layer and the second upper cladding layer until the etch stopping layer is exposed using the first insulating film as a mask, and performing the second removal process by selectively etching the first contact layer, the second semiconductor layer, the second upper cladding layer, and the first semiconductor layer until the etch stopping layer is exposed. Therefore, the etching is performed with high controllability and easily.

DETAILED DESCRIPTION OF THE PREFERRED EMBODIMENTS

Embodiment 1.

Figure 1:
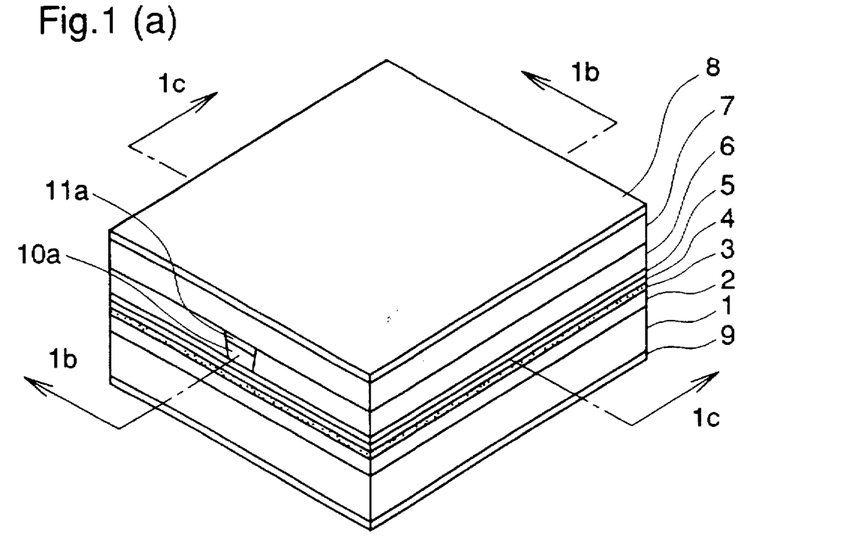
FIGS. 1(a)–1(c) are diagrams illustrating a structure of a semiconductor laser according to a first embodiment of the present invention.

FIGS. 1(a)–1(c) are diagrams illustrating a structure of a semiconductor laser according to a first embodiment of the present invention. FIG. 1(a) is a perspective view illustrating an entire semiconductor laser, FIG. 1(b) is a cross-sectional view taken along a line 1b—1b in FIG. 1(a), i.e., a cross-sectional view of the semiconductor laser in the resonator length direction. FIG. 1(c) is a cross-sectional view taken along a line 1c—1c in FIG. 1(a), i.e., a cross-sectional view in the resonator width direction including a ridge structure region. In the figure, reference numeral 1 designates an n type GaAs semiconductor substrate, numeral 2 designates an n type $Al_{0.5}Ga_{0.5}As$ lower cladding layer 1.5~2 µm thick, and numeral 3 designates a quantum well structure layer serving as an active layer and comprising an $Al_{0.5}Ga_{0.95}As$ well layer (not shown) and two $Al_zGa_{1-z}As$ barrier layers (not shown) with an aluminum composition ratio z of 0.3~0.35. This quantum well structure layer 3 includes light guide layers 0.2~0.3 µm thick having the same composition as the barrier layer at both ends thereof, and a well layer about 80 µm thick and a barrier layer 50~80 µm thick are alternately laminated as three layers, that is, two well layers and a barrier layer are laminated, between the light guide layers. Numeral 4 designates a p type $Al_{0.5}Ga_{0.5}As$ first upper cladding layer 0.05~0.5 µm thick, numeral 5 designates a p type $Al_{0.7}Ga_{0.3}As$ etch stopping layer about 200 Å thick, numeral 6 designates an n type $Al_{0.7}Ga_{0.3}As$ current blocking layer 1.5~2 µm thick, and numeral 7 designates a p type GaAs second contact layer 2~3 µm thick. Numeral 8 designates a p side electrode, numeral 9 designates an n side electrode, numeral 10 designates a p type $Al_{0.5}Ga_{0.5}As$ second upper cladding layer 0.8~1.3 µm thick, and numeral 11 designates a p type GaAs first contact layer about 0.7 µm thick. Numeral 22 designates a ridge structure. This ridge structure 22 has a reverse-trapezoidal configuration such that the the resonator width on the side of the n side electrode 9 is about 4 µm and the width on the side of the p side electrode 8 is about 5~6 µm. The edge of the ridge structure 22, in the resonator length direction, reaches the laser resonator facet, and the region other than the vicinity of the laser resonator facet comprises a p type $Al_{0.5}Ga_{0.5}As$ second upper cladding layer 10 and a p type GaAs contact layer 11 formed on the second upper cladding layer 10, the vicinity of the laser resonator facet comprises an n type $Al_{0.5}Ga_{0.5}As$ first burying layer 10a having the same composition as and an opposite conductivity type from the p type second upper cladding layer 10, and an n type GaAs second burying layer 11a having the same composition as and an opposite conductivity type from the p type first contact layer 11 formed on the burying layer 10a. Numeral 14 designates portions of the quantum well structure layer 3 disordered by ion implantation of silicon (Si). The semiconductor laser in this embodiment has a length in the resonator direction of 300~600 µm and a width of about 300 µm.

FIGS. 2(a)–2(d) are process diagrams illustrating the fabricating method of the semiconductor laser for one laser chip. In the figures, the same reference numerals as in FIG. 1(a) designate the same or corresponding parts. Reference numeral 20 designates a first insulating film, numeral 21 designates a second insulating film, numeral 25 designates an ion implantation of Si, numeral 32 designates a trapezoidal structure whose width is longer than that of the above-described ridge structure, and whose length in the resonator length direction is the same as those of the above-described second upper cladding layer 10 and first contact layer 11. The distances between an end of the trapezoidal structure 32 on the laser emitting facet side and the laser emitting facet is about 20 µm at both sides.

Figure 2:
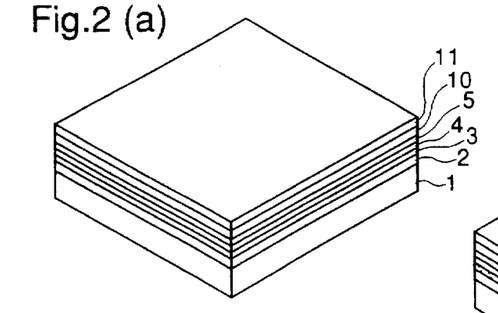
FIGS. 2(a)–2(g) are process diagrams illustrating a method of fabricating a semiconductor laser according to the first embodiment of the present invention.

A description is given of the fabricating method. Initially, an n type $Al_{0.5}Ga_{0.5}As$ cladding layer 2, a quantum well structure layer 3, a p type $Al_{0.5}Ga_{0.5}As$ first upper cladding layer 4, a p type $Al_{0.7}Ga_{0.3}As$ etch stopping layer 5, a p type $Al_{0.5}Ga_{0.5}As$ second upper cladding layer 10, and a p type GaAs first contact layer 11 are successively epitaxially grown on an n type GaAs semiconductor substrate 1, whereby a semiconductor laminated layer structure is obtained. A perspective view of the semiconductor laminated layer structure after the growth is shown in FIG. 2(a).

Then, an insulating film 20, such as $Si_3N_4$ or $SiO_2$, is formed on the semiconductor laminated layer structure, and the insulating film 20 is patterned in a striped shape that is omitted in the window structure region 31. The width of the stripe-shaped insulating film 20 is wider than that of the ridge structure 22 which is formed in the subsequent process. The insulating film 20 functions as an etching mask. A perspective view of the insulating film 20 after patterning is shown in FIG. 2(b).

Next, etching is performed using the insulating film as a mask. In this etching process, only the p type GaAs first contact layer 11 and the p type $Al_{0.5}Ga_{0.5}As$ second upper cladding layer 10 are etched, i.e., the etching is stopped at the p type $Al_{0.7}Ga_{0.3}As$ etch stopping layer 5, whereby the trapezoidal structure 32 is formed. The etch stopping layer 5 has a function such that etching is stopped. In order to perform the selective etching, an etchant that etches the p type GaAs first contact layer 7 and the p type $Al_{0.5}Ga_{0.5}As$ second upper cladding layer 6 but does not etch the p type $Al_{0.7}Ga_{0.3}As$ etch stopping layer 5 is employed. For example, a mixture of tartaric acid and hydrogen peroxide is employed. After the etching, ion implantation 25 is performed to the quantum well structure layer 3 through the region removed by etching as shown in FIG. 2(c). Si is suitable for the ion implantation. As a result, a region in which Si ions is implanted is formed in the quantum well structure layer 3 other than a region below the first ridge structure 32. Although the ion are incident on the entire surface of the semiconductor laminated layer structure, to ions are not implanted in the trapezoidal structure 32 because the trapezoidal structure has the insulating film thereon, whereby a space corresponding to the thickness of the insulating film 20 is produced between the first contact layer 11 at the surface of the trapezoidal structure 32 and the surface of the insulating film 20. The disordering of the quantum well structure layer 3 does not occur solely by the ion implantation, and it occurs for the first time when Si atoms are diffused in the crystal by some heat treatment. For the heat treatment, annealing is generally performed at above 700° C. while applying an As pressure to the wafer. In the heat treatment, Si diffuses in the quantum well structure layer 3, and disordering of the well layer occurs, whereby the Si ion implanted region becomes a disordered quantum well structure layer region 14. Since the effective band gap energy of the disordered region 14 is larger than that of the not disordered quantum well structure layer 3 positioned below the trapezoidal structure 32, the vicinity of the laser resonator facet of the disordered quantum well structure layer region 14 becomes the window structure region 31 which functions as the window structure for the laser light. In this embodiment, since the distance from the surface of the semiconductor laminated layer structure to the quantum well structure layer 3 in the region other than the trapezoidal structure 32, in other words, the thickness of the p type $Al_{0.5}Ga_{0.5}As$ first upper cladding layer 4, is 0.05~0.5 μm as described above, the accelerating voltage during the ion implantation is 60~600 keV. The condition for the ion implantation is set such that the conductivity type of the first upper cladding layer 4 is not inverted by the ion implantation.

Thereafter, using the insulating film 20 as a selective growth mask, an n type $Al_{0.5}Ga_{0.5}As$ first burying layer 10a and an n type GaAs second burying layer 11a are grown in the same thickness as the p type second upper cladding layer 10 and the p type first contact layer 11 respectively. FIG. 2(d) is a perspective view after the burying growth. After the selective growth, the first insulating film 20 is removed. As a removing method, wet etching using a hydrofluoric acid based etchant or dry etching using $CF_4$ gas is employed.

A second insulating film 21 is formed again on the entire semiconductor laminated layer structure and patterned in a striped shape having a width of 5~6 μm. As a material for the insulating film 21, $Si_3N_4$ or $SiO_2$ is used. The stripe of the second insulating film 21 extends to the laser resonator facet on through the first contact layer 11. This insulating film 21 functions as a mask for subsequent ridge etching. FIG. 2(e) shows a perspective view after the patterning of the insulating film 21.

A second ridge structure 22 is formed by performing selective etching again using the insulating film 21 as a mask. In this etching, as the etching for forming the trapezoidal structure 32, the first contact layer 10, the second upper cladding layer 11, the n type $Al_{0.5}Ga_{0.5}As$ first burying layer 10a, and the n type GaAs second burying layer 10b are etched, and the etching is stopped at the p type $Al_{0.7}Ga_{0.3}As$ etch stopping layer 5. Thus, the etch stopping layer 5 functions as an etch stopping layer twice. FIG. 2(f) shows a perspective view after the etching.

Selective growth is performed again using the second insulating film 21 as a mask, and an n type $Al_{0.7}Ga_{0.3}As$ current blocking layer 6 is formed to bury the ridge structure 22 as shown in FIG. 2(g). The crystal growth is not performed on the ridge structure 22 because the second insulating film 21 functions as a mask during the crystal growth.

Finally, after removing the second insulating film 21 by wet or dry etching, a p type GaAs second contact layer 11 is formed by crystal growth, and an n side electrode 13 is formed on the n type GaAs semiconductor substrate 1 and a p side electrode 12 is formed on the p type GaAs second contact layer 11, whereby the semiconductor laser having a window structure as shown in FIG. 1(a) is obtained.

A description is given of the operation. In the semiconductor laser having the ridge structure shown in FIG. 1(a), in the region where the n type $Al_{0.7}Ga_{0.3}As$ current blocking layer 6 is present, that is a region other than the region where the stripe shaped ridge structure 22 is formed, a pnp structure is formed between the p type $Al_{0.5}Ga_{0.5}As$ first upper cladding layer 4, the n type current blocking layer 6, and the p type GaAs second contact layer 7. Therefore, even when a voltage is applied so that the p side electrode becomes plus, one of the pn junctions of the pnp structure is a reverse biased, so that no current flows. In other words, the n type current blocking layer 6 blocks current flow. In the vicinity of the laser resonator facet of the ridge structure 22, pn junctions are formed between the p type $Al_{0.5}Ga_{0.5}As$ first upper cladding layer 4, the n type GaAs second burying layer 11a and the n type $Al_{0.5}Ga_{0.5}As$ first burying layer 10a, and the p type GaAs second contact layer 7. Accordingly, when a voltage is applied so that the p side electrode 8 becomes plus, and so that the n side electrode 9 becomes minus, holes are injected from the p side electrode 8 into the quantum well structure layer 3 formed below the ridge structure 22 through the p type first contact layer 11, the p type second upper cladding layer 10, and the p type first upper cladding layer 6, which are the region other than the vicinity of the resonator facet of the ridge structure 22, and electrons are injected from the n side electrode 9 into the quantum well structure layer 3 formed below the ridge structure 22 through the n type GaAs semiconductor substrate 1 and the n type AlGaAs lower cladding layer 2, whereby the recombination of electrons and holes occurs in the quantum well structure layer 3 below the p type second upper cladding layer 10 in the ridge structure 22, generating induced emission light. When injected quantity of carriers is sufficiently increased so that light exceeding the waveguide low is generated, laser oscillation occurs. Thus, the region below the p type second upper cladding layer 10 serves as a light emission region 30 of the semiconductor laser.

In the semiconductor laser according to this first embodiment, since the disordered quantum well structure layer 14 in the vicinity of the laser resonator facet has a larger band gap energy than that of the quantum well structure 3 in the light emitting region, laser light is not absorbed in the region of the disordered quantum well structure layer 14 in the vicinity of the laser resonator facet, whereby that region functions as a window structure. Thereby, destruction of the facet due to absorption of laser light is avoided, resulting in a high reliable semiconductor laser which is sufficient for practical use even if the light output is 2~3 times that of a conventional semiconductor laser having no window structure.

In this semiconductor laser, in the vertical direction, that is, perpendicular to the grown surface of the semiconductor substrate 1, the quantum well structure layer 3 positioned below the ridge structure 22 includes the light emission region 30 sandwiched by the p type $Al_{0.5}Ga_{0.5}As$ second upper cladding layer 10 and the n type $Al_{0.5}Ga_{0.5}As$ lower cladding layer 2, and the window structure region 31 sandwiched by the n type $Al_{0.5}Ga_{0.5}As$ first burying layer 10a and the n type $Al_{0.5}Ga_{0.5}As$ lower cladding layer 2, and both regions are sandwiched by semiconductor layers having a large energy band gap. Therefore, a refractive index distribution is produced in the vertical direction of the semiconductor laser 16, and the laser light in the vertical direction is confined in the vicinity of the quantum well structure layer 3 and guided without widening along the quantum well structure layer 3 and emitted from the laser resonator facet.

In the transverse direction, that is, the resonator width direction of the semiconductor laser 16, in the light emission region 30, the n type $Al_{0.7}Ga_{0.3}As$ current blocking layer 6 having a larger band gap energy than that of the p type $Al_{0.5}Ga_{0.5}As$ second upper cladding layer 10 constituting the ridge structure 22 is located on both sides of the ridge structure 22 in the resonator width direction, so that a refractive index distribution is produced over the quantum well structure layer 3 below and at both sides of the ridge structure 22. Therefore, the laser light generated in the quantum well structure layer 3 below the ridge structure 22 is confined within a region below the ridge structure 22 due to the refractive index difference between the second upper cladding layer 10 and the current blocking layer 6, and the laser light is guided without widening along the ridge structure 22. On the other hand, in the region constructed by the n type $Al_{0.5}Ga_{0.5}As$ first burying layer 10a of the ridge structure 22, that is, the window structure region 31, the n type $Al_{0.7}Ga_{0.3}As$ current blocking layer 6 having a larger band gap energy than that of the n type $Al_{0.5}Ga_{0.5}As$ first burying layer constituting the ridge structure 22 is formed on both sides of the resonator width direction of the ridge structure 22, so that refractive index distribution is produced over the quantum well structure layer 3 below and at the both sides of the ridge structure 22. Therefore, the light generated in the light emission region 30 is confined within the region below the ridge structure 22 also in the window structure region 31, and the light is guided without widening along the ridge structure 22 and emitted from the laser resonator facet. In the prior art semiconductor laser, since an astigmatism exists in both the vertical direction and the transverse direction, the emitted laser light is wider than the laser resonator facet in the vertical direction, and the light is guided and emitted is wider than the window structure region in the transverse direction, so that it is impossible to make the spot size small. However, in this embodiment, since such an astigmatism does not exist, the laser light is guided without widening in both the vertical direction and the transverse direction inside the semiconductor laser, and emitted from the laser resonator facet, so that the focus of the laser light can be adjusted in both the vertical direction and the transverse direction and the spot size can be made small.

In addition, since the ridge structures 22 on the light emission region 30 and on the window structure region 31 can comprise materials having the same energy band gap, the ridge structures do not adversely affect the laser characteristics.

According to the first embodiment of the present invention, the quantum well structure layer 3 which serves as an active layer and is disposed in the vicinity of the laser resonator facet is disordered, and the ridge structure 22 comprising the n type $Al_{0.5}Ga_{0.5}As$ first burying layer 10a and the n type GaAs second burying layer 11a in the vicinity of the laser resonator facet and comprising the p type $Al_{0.5}Ga_{0.5}As$ second upper cladding layer 10 and the p type GaAs first contact layer 11 in other regions, is provided, and the ridge structure 22 is buried with the n type $Al_{0.7}Ga_{0.3}As$ current blocking layer 6 having a larger band gap energy than the n type $Al_{0.5}Ga_{0.5}As$ first burying layer 10a and the p type $Al_{0.5}Ga_{0.5}As$ second upper cladding layer 10. Therefore, the band gap energy of the quantum well structure in the vicinity of the laser resonator facet is larger than that in the light emission region, whereby a window structure is formed. In addition, there is no astigmatism due to the presence and the absence of a refractive index distribution in the vertical and transverse directions of the laser. As a result, a semiconductor laser having a window structure and providing a small spot size is realized.

Embodiment 2.

Figure 3:
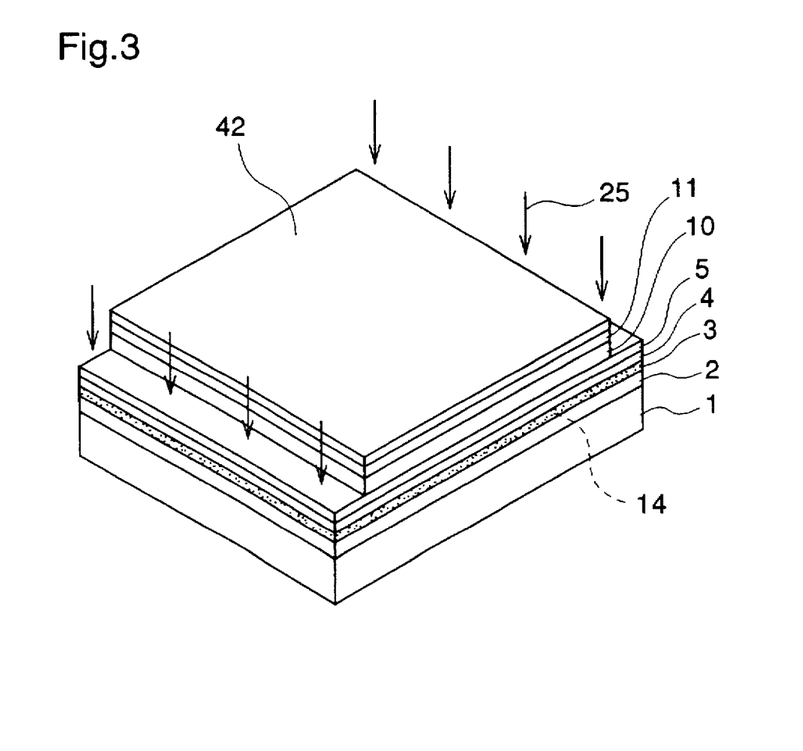
FIG. 3 is a diagram illustrating a main process of a method of fabricating a semiconductor laser according to a second embodiment of the present invention.

FIG. 3 is a perspective view illustrating a main process step in a method of fabricating a semiconductor laser according to a second embodiment of the present invention. In the figure, the same reference numerals as in FIG. 2(g) designate the same or corresponding parts. Reference numeral 42 designates an insulating film.

In this second embodiment, as shown in FIG. 3, in place of forming the trapezoidal structure 32 in the method of fabricating a semiconductor laser described as the first embodiment, a semiconductor laminated layer structure is selectively etched until the etch stopping layer 5 is exposed using an insulating film 42 having an aperture in the vicinity of the laser resonator facet as a mask, and Si ion implantation 25 is performed to a region exposed by the etching, thereby disordering the quantum well structure layer. Therefore, the n type $Al_{0.5}Ga_{0.5}As$ first burying layer 10a and the n type GaAs second burying layer 11a are formed on the region exposed by the etching, and subsequently, the same process steps as shown in FIGS. 2(e)–2(g) are performed. Also in this second embodiment, the same effect as in the first embodiment is obtained.

While an n type substrate is used as a semiconductor substrate in the first and second embodiments, a p type substrate can also be used in the present invention with the same effects as in the above-described embodiments.

While a quantum well structure layer comprising a three-layer structure is used as a quantum well structure layer which serves as an active layer in the first and the second embodiments, more quantum well layers, such as a multi quantum well structure layer, can also be used in the present invention with the same effects as in the above-described embodiments.

While AlGaAs series material is used for the semiconductor laser in the first and second embodiments, InP series material or the like can also be used in the semiconductor laser in the present invention with the same effects as in the above-described embodiments.

What is claimed is:

1. A semiconductor laser having resonator facets and comprising:

a first conductivity type semiconductor substrate;

a first conductivity type lower cladding layer disposed on said first conductivity type semiconductor substrate;

a quantum well structure active layer comprising alternately laminated barrier layers and well layers, disposed on said lower cladding layer, disordered regions in said quantum well structure active layer extending between the resonator facets and sandwiching a central region of said quantum well structure active layer;

a second conductivity type first upper cladding layer disposed on said quantum well structure active layer;

a ridge structure disposed on said first upper cladding layer opposite the central region of said quantum well structure active layer, extending in a resonator length direction, and reaching the resonator facets, said ridge structure having a first region, other than proximate the laser resonator facets, comprising a second conductivity type second upper cladding layer and a second conductivity type first contact layer, disposed on said second upper cladding layer, and a second region, adjacent a resonator facet, comprising a first conductivity type first semiconductor layer of the same material and thickness as said second upper cladding layer and a first conductivity type second semiconductor layer of the same material as said first contact layer and disposed on said first semiconductor layer, said first contact layer being a different material from said second upper cladding layer;

a first conductivity type current blocking layer having an energy band gap larger than that of said second upper cladding layer, disposed on said first upper cladding layer, and burying said ridge structure; and a second conductivity type second contact layer disposed on said current blocking layer and said ridge structure.

2. The semiconductor laser of claim 1 wherein, said semiconductor substrate comprises n type GaAs;

said lower cladding layer comprises n type $Al_xGa_{1-x}As$ ($0<x$);

said quantum well structure active layer comprises $Al_yGa_{1-y}As$ ($0<y$) barrier layers and $Al_zGa_{1-z}As$ ($0 \leq z < y$) well layers, and has an effective energy band gap smaller than that of said lower cladding layer;

said first and second upper cladding layers comprise p type $Al_wGa_{1-w}As$ having a larger effective energy band gap than that of said quantum well structure active layer;

said first and second contact layers comprise p type GaAs;

said first semiconductor layer comprises n type $Al_wGa_{1-w}As$;

said second semiconductor layer comprises n type GaAs; and said current blocking layer comprises n type $Al_vGa_{1-v}As$ ($v>w$).

* * * * *